United States Patent
Noh et al.

(10) Patent No.: US 11,034,590 B2
(45) Date of Patent: Jun. 15, 2021

(54) BASNO₃ THIN FLIM AND LOW-TEMPERATURE PREPARATION METHOD THEREFOR

(71) Applicants: KOREA RESEARCH INSTITUTE OF CHEMICAL TECHNOLOGY, Daejeon (KR); UNIST(ULSAN NATIONAL INSTITUTE OF SCIENCE AND TECHNOLOGY), Ulsan (KR)

(72) Inventors: Jun Hong Noh, Daejeon (KR); Seong Sik Shin, Seoul (KR); Jang Won Seo, Seoul (KR); Sang Il Seok, Daejeon (KR)

(73) Assignees: KOREA RESEARCH INSTITUTE OF CHEMICAL TECHNOLOGY, Daejeon (KR); UNIST(ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 253 days.

(21) Appl. No.: 16/090,953

(22) PCT Filed: Apr. 4, 2017

(86) PCT No.: PCT/KR2017/003702
§ 371 (c)(1),
(2) Date: Oct. 3, 2018

(87) PCT Pub. No.: WO2017/176038
PCT Pub. Date: Oct. 12, 2017

(65) Prior Publication Data
US 2020/0325032 A1   Oct. 15, 2020

(30) Foreign Application Priority Data
Apr. 4, 2016 (KR) .................. 10-2016-0040923

(51) Int. Cl.
*H01L 21/00* (2006.01)
*C01G 19/00* (2006.01)
(Continued)

(52) U.S. Cl.
CPC ........... *C01G 19/006* (2013.01); *B05D 1/005* (2013.01); *B05D 3/0254* (2013.01);
(Continued)

(58) Field of Classification Search
CPC .... C01G 19/006; B05D 1/005; B05D 3/0254; H01G 9/2027; C01P 2002/34;
(Continued)

(56) References Cited

U.S. PATENT DOCUMENTS

2002/0175622 A1* 11/2002 Otani .................. H01J 9/02
313/518
2003/0034541 A1* 2/2003 Essick ................. H01L 27/0605
257/505

FOREIGN PATENT DOCUMENTS

JP    2002275390 A    9/2002
KR    101108018 B1    1/2012
(Continued)

OTHER PUBLICATIONS

Translation of KR 10-145702 B1, 2020.*
(Continued)

*Primary Examiner* — Richard A Booth
(74) *Attorney, Agent, or Firm* — McCoy Russell LLP (57) ABSTRACT

The present invention relates to a method for preparing a BaSnO₃ thin film, comprising the steps of: a) precipitating an amorphous precipitate by adding an alkaline aqueous solution to a mixture solution comprising a barium salt, a tin salt, hydrogen peroxide, and an organic acid; b) preparing a crystalline BaSnO₃ precursor material by preheating the mixture solution containing the amorphous precipitate; c)
(Continued)

preparing a dispersion solution by dispersing the crystalline BaSnO₃ precursor material in a polar organic solvent; d) coating the dispersion solution on a substrate; and e) preparing a BaSnO₃ thin film of a perovskite structure by heat treating the dispersion solution coated on the substrate.

5 Claims, 3 Drawing Sheets

(51) Int. Cl.
  *B05D 1/00* (2006.01)
  *B05D 3/02* (2006.01)
  *H01G 9/20* (2006.01)
  *H01L 51/42* (2006.01)

(52) U.S. Cl.
  CPC ....... *H01G 9/2027* (2013.01); *C01P 2002/34* (2013.01); *C01P 2002/72* (2013.01); *C01P 2004/04* (2013.01); *C01P 2004/64* (2013.01); *C01P 2006/40* (2013.01); *H01L 51/422* (2013.01)

(58) Field of Classification Search
  CPC .............. C01P 2002/72; C01P 2004/04; C01P 2004/64; C01P 2006/40; H01L 51/422
  See application file for complete search history.

(56) References Cited

FOREIGN PATENT DOCUMENTS

| KR | 20140018447 A | 2/2014 |
|---|---|---|
| KR | 101475702 B1 | 12/2014 |

OTHER PUBLICATIONS

Lu, W. et al., "Hydrothermal synthesis of nanocrystalline BaSnO3 using a SnO2—xH2O sol," Journal of the European Ceramic Society, vol. 25, No. 6, Mar. 2005, 7 pages.

Kim, D. et al., "BaSnO3 Perovskite Nanoparticles for High Efficiency Dye-Sensitized Solar Cells," ChemSusChem, vol. 6, No. 3, Mar. 2013, Published Online Feb. 18, 2013, 6 pages.

ISA Korean Intellectual Property Office, International Search Report Issued in Application No. PCT/KR2017/003702, dated Jun. 27, 2017, WIPO, 4 pages.

\* cited by examiner

# BASNO₃ THIN FLIM AND LOW-TEMPERATURE PREPARATION METHOD THEREFOR

CROSS-REFERENCE TO RELATED APPLICATIONS

The present application is a U.S. National Phase of International Patent Application Serial No. PCT/KR2017/003702 entitled "BASNO3 THIN FILM AND LOW-TEMPERATURE PREPARATION METHOD THEREFOR," filed on Apr. 4, 2017. International Patent Application Serial No. PCT/KR2017/003702 claims priority to Korean Patent Application No. 10-2016-0040923, filed on Apr. 4, 2016. The entire contents of each of the above-cited applications are hereby incorporated by reference in their entirety for all purposes.

TECHNICAL FIELD

The present invention relates to a $BaSnO_3$ thin film and a method for preparing the same at a low temperature.

BACKGROUND ART

A crystalline oxide semiconductor is mainly used in applications such as a thin film transistor, a semiconductor for a solar cell, a transparent conductive film and the like, due to merits such as high charge mobility, high visible light transmittance by wide band gap, high stability and the like.

However, in order to prepare a crystalline oxide in general, high heat treatment temperature is needed, and in order to form the crystalline oxide into a thin film, high-priced chemical or physical deposition equipment should be used, and thus, there is a problem in mass production at low cost.

In particular, a $BaSnO_3$ semiconductor is a stable oxide having a high charge mobility, and used for various application fields, but has a limitation in the application thereof due to a very high crystallization temperature of 900° C. or more.

As a specific example, Korean Patent Laid-Open Publication No. 10-2014-0018447 discloses that $SnCl_{4\text{-}5}H_2O$, $BaCl_2\text{-}2H_2O$ and a hydrogen peroxide solution are used to synthesize an amorphous $BaSn(O_2)O_2\text{-}3H_2O$ precipitate, which is then heat treated at a high temperature of 900° C., thereby synthesizing perovskite crystalline phase $BaSnO_3$ powder.

However, the thus-synthesized perovskite crystalline phase $BaSnO_3$ powder has a demerit in being not easily dispersed in a solvent and easily aggregated, and thus, it was difficult to prepare a $BaSnO_3$ thin film with a dispersion in which the perovskite crystalline phase $BaSnO_3$ powder is simply dispersed in a solvent, and even in the case that the $BaSnO_3$ thin film is prepared, defects such as a pin hole easily occurs due to aggregation of the $BaSnO_3$ powder, and a dense and flat film is hardly formed, and thus, it was difficult to use the film as a semiconductor film of a photoelectric element, and in particular, there was a problem of very low conversion efficiency of a solar cell to which the film was applied.

For this reason, in Korean Patent Laid-Open Publication No. 10-2014-0018447, a simple method of dispersing the synthesized perovskite crystalline phase $BaSnO_3$ powder in a solvent was not able to be used, and a paste in which perovskite crystalline phase $BaSnO_3$ powder and an organic material are mixed is coated on a substrate to form a porous $BaSnO_3$ thick film having a thickness of several micrometers or more.

However, with this method, a post heat treatment for removing the organic material must be performed, and the organic material was not completely removed by the post heat treatment and remained as an impurity, thereby having a problem of the lowered conversion efficiency of a solar cell. In addition, since the aggregation of perovskite crystalline phase $BaSnO_3$ powder still occurs, a uniform thin film of $BaSnO_3$ of 1 μm or less was not able to be prepared, and there was a problem in that the maximum conversion efficiency of photoelectric energy was only 5.2%.

In order to solve the above problems, the inventors of the present invention found that a dense and flat perovskite $BaSnO_3$ thin film having a thickness of 1 μm or less may be prepared at a significantly low temperature as compared with the case of conventional heat treatment at a high temperature of 900° C., by first synthesizing a crystalline precursor having a low crystallization temperature, and then using a dispersion in which the crystalline precursor is dispersed in a polar organic solvent to prepare a $BaSnO_3$ thin film, thereby completing the present invention.

DISCLOSURE

Technical Problem

In order to solve the above-described problems, an object of the present invention is to provide a $BaSnO_3$ thin film in which $BaSnO_3$ of a perovskite structure is very uniformly dispersed and coated, and a method for preparing the same at a low temperature.

Technical Solution

In order to achieve the above object, the present invention relates to a method for preparing a $BaSnO_3$ thin film at a low temperature including: a) adding an alkaline aqueous solution to a mixed solution including a barium salt, a tin salt, a hydrogen peroxide solution and an organic acid to precipitate an amorphous precipitate; b) preheat-treating the mixed solution including the amorphous precipitate to prepare a crystalline $BaSnO_3$ precursor material; c) dispersing the crystalline $BaSnO_3$ precursor material in a polar organic solvent to prepare a dispersion; d) coating the dispersion on a substrate; and e) heat-treating the dispersion coated on the substrate to prepare a $BaSnO_3$ thin film of a perovskite structure.

Specifically, the method for preparing a $BaSnO_3$ thin film at a low temperature according to an exemplary embodiment of the present invention may include: a) adding an alkaline aqueous solution to a mixed solution including a barium salt, a tin salt, a hydrogen peroxide solution and an organic acid to precipitate an amorphous precipitate; b) preheat-treating the mixed solution including the amorphous precipitate at 40 to 100° C. to prepare a crystalline $BaSnO_3$ precursor material; c) dispersing the crystalline $BaSnO_3$ precursor material in a polar organic solvent to prepare a dispersion; d) coating the dispersion on a substrate; and e) heat-treating the dispersion coated on the substrate at 150 to 600° C. to prepare a $BaSnO_3$ thin film of a perovskite structure.

Another general aspect relates to a crystalline $BaSnO_3$ precursor material which is primary particles having an average particle diameter of 5 to 100 nm; and a crystalline $BaSnO_3$ precursor dispersion, a crystalline $BaSnO_3$ precursor paste, and a crystalline BaSnO$_3$ precursor thin film including the crystalline BaSnO$_3$ precursor material.

Another general aspect relates to BaSnO$_3$ nanoparticles of a perovskite structure which are primary particles having an average particle diameter of 5 to 100 nm; and a BaSnO$_3$ nanoparticle dispersion of a perovskite structure, BaSnO$_3$ nanoparticle paste of a perovskite structure, and a BaSnO$_3$ thin film of a perovskite structure including the BaSnO$_3$ nanoparticles of a perovskite structure.

In another general aspect, an inorganic-organic hybrid halide perovskite solar cell includes a BaSnO$_3$ thin film of a perovskite structure prepared with a BaSnO$_3$ nanoparticle dispersion or paste of a perovskite structure having an average particle diameter of 5 to 100 nm.

In still another general aspect, a method for synthesizing BaSnO$_3$ nanoparticles includes: A) adding an alkaline aqueous solution to a mixed solution including a barium salt, a tin salt, a hydrogen peroxide solution and an organic acid to precipitate an amorphous precipitate; B) preheat-treating the mixed solution including the amorphous precipitate prepare a crystalline BaSnO$_3$ precursor material; and C) heat-treating the crystalline BaSnO$_3$ precursor material to synthesize BaSnO$_3$ nanoparticles of a perovskite structure.

Advantageous Effects

The BaSnO$_3$ thin film and the method for preparing the same at low temperature according to the present invention are to prepare a BaSnO$_3$ thin film containing pure perovskite crystalline phase BaSnO$_3$ only with heat treatment at a low temperature, by first preparing a crystalline BaSnO$_3$ precursor material which may be easily transferred to a perovskite structure, and then dispersing the crystalline BaSnO$_3$ precursor material in a polar organic solvent and heat-treating the dispersion.

In addition, by using a dispersion in which a crystalline BaSnO$_3$ precursor material having excellent dispersibility in a polar organic solvent is dispersed in a polar organic solvent, aggregation of BaSnO$_3$ particles when preparing a BaSnO$_3$ thin film may be prevented, and perovskite crystalline phase BaSnO$_3$ is very evenly dispersed, thereby preparing a flat and dense BaSnO$_3$ thin film.

In addition, as a mixed dispersion in which a crystalline BaSnO$_3$ precursor material and a polar organic solvent are mixed is used, it is not necessary to remove impurities such as an organic material and the like, and the probability that impurities remain in the thin film is significantly reduced, thereby greatly improving efficiency of a battery.

In addition, unlike conventional TiO$_2$ which has been mainly used as a solar cell electrode, BaSnO$_3$ may have a less photocatalytic effect, thereby greatly improving stability of a perovskite solar cell.

BEST MODE

Hereinafter, a BaSnO$_3$ thin film, a method for preparing the same at a low temperature, a crystalline BaSnO$_3$ precursor material, and BaSnO$_3$ nanoparticles of a perovskite structure according to the present invention will be described in detail with reference to accompanying drawings. The drawings to be provided below are provided by way of example so that the idea of the present invention can be sufficiently transferred to a person skilled in the art to which the present invention pertains. Therefore, the present invention is not limited to the drawings provided below but may be embodied in many different forms, and the drawings suggested below may be exaggerated in order to clear describe the spirit of the present invention. In addition, like reference numerals denote like elements throughout the specification.

Technical terms and scientific terms used herein have the general meaning understood by those skilled in the art to which the present invention pertains unless otherwise defined, and a description for the known function and configuration obscuring the gist of the present invention will be omitted in the following description and the accompanying drawings.

In addition, 'the crystalline BaSnO$_3$ precursor material' in the present invention refers to an intermediate phase material for forming BaSnO$_3$ of a perovskite structure, and may have a perovskite structure or an incomplete perovskite structure.

In order to prepare crystalline BaSnO$_3$ generally requiring a very high crystallization temperature, a step of heat treatment at a high temperature of 900° C. or more should be taken, and in order to form the crystalline BaSnO$_3$ into a thin film, high-priced chemical or physical deposition equipment should be used, and thus, there was a problem in mass production at low cost.

Thus, the present applicant conducted a further study on preparation of a BaSnO$_3$ thin film containing crystalline BaSnO$_3$ even by heat treatment at a low temperature, and as a result, found that when forming crystalline BaSnO$_3$ from a crystalline intermediate phase having a low crystallization temperature, a BaSnO$_3$ thin film containing crystalline BaSnO$_3$ may be prepared at a significantly low temperature as compared with conventional heat treatment at a high temperature of 900° C., thereby completing the present invention.

Specifically, a method for preparing a BaSnO$_3$ thin film at a low temperature according to an exemplary embodiment of the present invention may include: a) adding an alkaline aqueous solution to a mixed solution including a barium salt, a tin salt, a hydrogen peroxide solution and an organic acid to precipitate an amorphous precipitate; b) preheat-treating the mixed solution including the amorphous precipitate to prepare a crystalline BaSnO$_3$ precursor material; c) dispersing the crystalline BaSnO$_3$ precursor material in a polar organic solvent to prepare a dispersion; d) coating the dispersion on a substrate; and e) heat-treating the dispersion coated on the substrate to prepare a BaSnO$_3$ thin film of a perovskite structure.

In the case of preparing the conventional BaSnO$_3$ thin film, heat treatment at a high temperature of 900° C. or more should be performed for forming BaSnO$_3$ of a perovskite structure, however, in the present invention, a crystalline BaSnO$_3$ precursor material which may be easily transferred to a perovskite structure is first prepared, and then heat-treated, thereby preparing a BaSnO$_3$ thin film containing pure perovskite crystalline phase BaSnO$_3$ only with heat treatment at a low temperature.

In addition, in the case of preparing a dispersion using perovskite crystalline phase BaSnO$_3$ particles prepared by heat treatment at a high temperature of 900° C. or more as conventionally prepared, BaSnO$_3$ particles are not evenly dispersed in the dispersion, and aggregation of BaSnO$_3$ particles may occur. Accordingly, when preparing a BaSnO$_3$ thin film using the dispersion, defects may easily occur, and efficiency of a battery was lowered.

However, in the present invention, by using a dispersion in which a crystalline BaSnO$_3$ precursor material having excellent dispersibility in a polar organic solvent is dispersed in a polar organic solvent, aggregation of BaSnO$_3$ particles when preparing a BaSnO$_3$ thin film may be prevented, and perovskite crystalline phase BaSnO$_3$ is very evenly dispersed, thereby preparing a flat and dense BaSnO$_3$ thin film.

Besides, when preparing the conventional BaSnO$_3$ thin film, a paste in which perovskite crystalline phase BaSnO$_3$ particles and an organic material are mixed is used to prepare the thin film, thereby requiring a further heat treatment process for removing the organic material, and the organic material or impurities thereof which were not completely removed remained in the thin film after the heat treatment, thereby having a disadvantage of further lowering battery efficiency. However, as the present invention uses a mixed dispersion in which a crystalline BaSnO$_3$ precursor material and a polar organic solvent are mixed, it is not necessary to remove impurities such as an organic material and the like, and the probability that impurities remain in the thin film is significantly reduced, thereby greatly improving efficiency of a battery.

In addition, unlike the conventional TiO$_2$ thin film which has been mainly used as a solar cell electrode, the BaSnO$_3$ thin film may have a less photocatalytic effect, thereby greatly improving stability of a perovskite solar cell.

Hereinafter, a method for preparing a BaSnO$_3$ thin film at a low temperature according to an exemplary embodiment of the present invention will be described in more detail.

First, step a) of adding an alkaline aqueous solution to a mixed solution including a barium salt, a tin salt, a hydrogen peroxide solution and an organic acid to precipitate an amorphous precipitate may be performed.

In an exemplary embodiment of the present invention, it is preferred to add the barium salt and the tin salt at a mole ratio of 1:0.8 to 1.2, and more preferably at a mole ratio of 1:1, for preparing a BaSnO$_3$ thin film containing pure perovskite crystalline phase BaSnO$_3$ when forming a thin film later. Here, as the barium salt and the tin salt, any inorganic salt source may be used without a limitation, as long as it is commonly used in the art, and as a specific example thereof, the barium salt may be any one or two or more selected from the group consisting of BaCl$_2$, Ba(NO$_3$)$_2$, BaSO$_4$, Ba(OH)$_2$, Ba(CH$_3$COO)$_2$ and hydrates thereof; and the tin salt may be any one or two or more selected from the group consisting of SnCl$_4$, Sn(NO$_3$)$_4$, Sn(SO$_4$)$_2$, Sn(OH)$_4$, Sn(CH$_3$COO)$_4$ and hydrates thereof.

In an exemplary embodiment of the present invention, the hydrogen peroxide solution may inhibit formation of a BaSn(OH)$_6$ intermediate phase, effectively form an amorphous precipitate satisfying BaSnO$_{3-x}$(O$_2$)$_x$nH$_2$O mOH (wherein x is a real number of 0≤x≤3, n is a real number of 0≤n≤4, and m is a real number of 0≤n≤4), and prepare a crystalline phase BaSnO$_3$ precursor material after preheating treatment. Here, in order to prepare a crystalline phase BaSnO$_3$ precursor material, it is necessary to adjust a concentration of the hydrogen peroxide solution, and specifically, the concentration of the hydrogen peroxide solution is preferably 10 to 50 vol %, more preferably 12 to 35 vol %. When the concentration of the hydrogen peroxide solution is less than 10 vol %, the crystalline BaSnO$_3$ precursor material is not synthesized, and accordingly, it may be difficult to prepare perovskite crystalline phase BaSnO$_3$ nanoparticles only with the subsequent heat treatment at a low temperature.

In addition, it is preferred to vary an amount of hydrogen peroxide solution to be added, which is mixed in the mixed solution, depending on the concentration of the hydrogen peroxide solution. As a specific example, when the concentration of the hydrogen peroxide solution is 10 to 50 vol %, 5 to 500 ml of the hydrogen peroxide solution may be added, with respect to 0.01 mol of the barium salt, and preferably 20 to 300 ml of the hydrogen peroxide solution may be added, with respect to 0.01 mol of the barium salt.

In an exemplary embodiment of the present invention, the organic acid is added for inhibiting aggregation of primary particles when forming the amorphous precipitate, and as described below, when adding the alkaline aqueous solution to the mixed solution of the present invention, an amorphous precipitate is immediately formed, and the amorphous precipitate is an aggregate of primary particles, and the organic acid may be added to inhibit the aggregation of primary particles to form the amorphous precipitate having a very fine size. In order to maximize the effect, it is preferred to adjust an amount of organic acid to be added, and specifically, the organic acid may be added at 0.01 to 10 mol, more preferably at 0.05 to 5 mol, still more preferably at 0.1 to 2 mol, with respect to 1 mol of the barium salt, for synthesizing nano-sized amorphous precipitate and crystalline BaSnO$_3$ precursor material.

The organic acid may be used without a particular limitation as long as it is used in the art, and specific examples thereof may be any one or two or more selected from the group consisting of citric acid, ascorbic acid, formic acid, acetic acid, butanoic acid, pentanoic acid, malonic acid, maleic acid, glycolic acid, succinic acid, glutaric acid, tartaric acid, propionic acid, gluconic acid, fumaric acid, adipic acid, glutaric acid and oxalic acid.

As described above, when preparing the mixed solution including the barium salt, the tin salt, the hydrogen peroxide solution and the organic acid, an alkaline aqueous solution may be added to the mixed solution to precipitate an amorphous precipitate. The alkaline aqueous solution changes the condition of the mixed solution to basic, so that an inorganic salt source is precipitated into an amorphous precipitate, and as a specific example, the alkaline aqueous solution may be added to the mixed solution so that the pH of the mixed solution is 9 to 11.

The alkaline aqueous solution is not particularly limited as long as it is commonly used in the art, and specifically for example, may be any one or two or more selected from the group consisting of ammonia water, an aqueous sodium hydroxide solution, an aqueous potassium hydroxide solution, an aqueous calcium hydroxide solution, an aqueous magnesium hydroxide solution, an aqueous sodium hydrogen carbonate solution and the like.

As such, the precipitate may be amorphous particles satisfying $BaSnO_{3-x}(O_2)_x \cdot nH_2O \cdot mOH$ (wherein x is a real number of $0 \leq x \leq 3$, n is a real number of $0 \leq n \leq 4$, and m is a real number of $0 \leq n \leq 4$), which is preheat-treated to be crystallized into a crystalline $BaSnO_3$ precursor material having a pure perovskite crystalline phase or an incomplete perovskite crystalline phase.

Specifically, after the precipitation step, step b) of preheat-treating the mixed solution including the amorphous precipitate to prepare a crystalline $BaSnO_3$ precursor material may be performed. When the amorphous precipitate is aged at room temperature (25° C.), the amorphous precipitate is not crystallized and retains an amorphous form, however, when the precipitate is preheat-treated, the particles are crystallized to be transformed into a crystalline $BaSnO_3$ precursor material having a crystalline phase.

Specifically, in an exemplary embodiment of the present invention, the preheating treatment in step b) may be performed at 40 to 100° C. Within the range, the amorphous precipitate is easily transformed into a crystalline phase $BaSnO_3$ precursor material, and a $BaSnO_3$ thin film containing $BaSnO_3$ of a pure perovskite structure may be prepared later, and conversion efficiency of a solar cell including the thin film may be significantly improved.

In addition, in an exemplary embodiment of the present invention, the preheating treatment in step b) may be performed for 10 minutes to 48 hours, and more preferably 0.5 hours to 24 hours. Within the range, the amorphous precipitate may be completely transformed into a crystalline $BaSnO_3$ precursor material having a crystalline phase.

It may be more advantageous that thus-prepared crystalline $BaSnO_3$ precursor material has an average particle diameter of 5 to 100 nm, and more preferably 10 to 30 nm, for improving conversion efficiency later when manufacturing a solar cell.

Here, when the manufacture of the $BaSnO_3$ precursor material is completed by the preheating treatment in step b), the crystalline $BaSnO_3$ precursor material may be subjected to washing and drying processes by a common method.

Next, step c) dispersing the crystalline $BaSnO_3$ precursor material in a polar organic solvent to prepare a dispersion may be performed.

As described above, in the case of preparing a dispersion using perovskite crystalline phase $BaSnO_3$ particles prepared by heat treatment at a high temperature of 900° C. or more, $BaSnO_3$ particles are not evenly dispersed in the dispersion, and aggregation of $BaSnO_3$ particles may occur. Accordingly, when preparing a $BaSnO_3$ thin film using the dispersion, defects may easily occur, and efficiency of a battery was lowered. However, in the present invention, by using a dispersion in which a crystalline $BaSnO_3$ precursor material having excellent dispersibility in a polar organic solvent is dispersed in a polar organic solvent, aggregation of $BaSnO_3$ particles when preparing a $BaSnO_3$ thin film may be prevented, and perovskite crystalline phase $BaSnO_3$ is very evenly dispersed, thereby preparing a flat and dense $BaSnO_3$ thin film.

In an exemplary embodiment of the present invention, the polar organic solvent is not particularly limited as long as the crystalline $BaSnO_3$ precursor material is well dispersed in the solvent, and as an example, may be a protic polar organic solvent, an aprotic polar organic solvent or a mixture thereof. Specifically, the protic polar organic solvent may be water such as distilled water and purified water; alcohol-based solvents such as methanol, ethanol, methoxyethanol, propanol, isopropanol, butanol and isobutanol; acid solvents such as acetic acid and formic acid; a nitro-based solvent such as nitromethane; and the like, but not limited thereto. The aprotic polar organic solvent may be ketone-based solvent such as acetone, methylethylketone and methylisobutylketone; ester-based solvent such as ethyl acetate, butyl acetate and 3-methoxy-3-methyl butyl acetate; amine-based solvent such as dimethyl formamide, methyl pyrrolidone and dimethylacetamide; ether-based solvents such as tetrahydrofuran, 2-methyltetrahydrofuran, dimethylether and dibutylether; and the like, but not limited thereto.

In an exemplary embodiment of the present invention, it is preferred that mixing ratio of the crystalline $BaSnO_3$ precursor material and the polar organic solvent is adjusted so that coating is easily performed and the $BaSnO_3$ thin film is formed without an empty grid point. As a specific example, 10 to 200 ml of the polar organic solvent may be mixed, with respect to 1 g of the crystalline $BaSnO_3$ precursor material, but not necessarily limited thereto, and the amount may be adjusted variously depending on the thickness of the thin film to be prepared and the like.

When the dispersion in which the crystalline $BaSnO_3$ precursor material is dispersed in the polar organic solvent is prepared, step d) coating the dispersion on a substrate may be performed.

The coating method is not particularly limited as long as it is used in the art, and as a specific example thereof, the coating may be performed by the method such as screen printing; spin coating; bar coating; gravure coating; blade coating; roll coating, or the like.

In an exemplary embodiment of the present invention, the substrate may be a rigid substrate or a flexible substrate, and the rigid substrate may include a glass substrate, an indium tin oxide coated glass (ITO glass) substrate, an F-doped tin oxide coated glass (FTO glass) substrate or the like, and the flexible substrate may include polyethylene terephthalate (PET); polyethylene naphthalate (PEN); polyimide (PI); polycarbonate (PC); polypropylene (PP); triacetylcellulose (TAC); polyethersulfone (PES) or the like.

Next, step e) heat-treating the dispersion coated on the substrate to prepare a $BaSnO_3$ thin film of a perovskite structure may be performed.

As described above, in the case of preparing the conventional $BaSnO_3$ thin film, heat treatment at a high temperature of 900° C. or more should be performed for forming $BaSnO_3$ of a perovskite structure, however, in the present invention, a crystalline $BaSnO_3$ precursor material which may be easily transferred to a perovskite structure is first prepared, and then dispersed in the polar organic solvent and heat-treated, thereby preparing a $BaSnO_3$ thin film containing pure perovskite crystalline phase $BaSnO_3$ only with heat treatment at a low temperature.

In an exemplary embodiment of the present invention, the heat treatment in step e) may be performed at 100 to 600° C., more preferably at 400 to 550° C. for more effective preparation of the $BaSnO_3$ thin film, which leads to very good conversion efficiency when manufacturing a solar cell.

In addition, another exemplary embodiment of the present invention provides a crystalline $BaSnO_3$ precursor material and $BaSnO_3$ nanoparticles of a perovskite structure, prepared during the method for preparing the $BaSnO_3$ thin film at a low temperature, and also provides a dispersion, a paste and a thin film which includes the precursor material and the nanoparticles.

Specifically, the crystalline BaSnO$_3$ precursor material according to an exemplary embodiment of the present invention may be primary particles having an average particle diameter of 5 to 100 nm. Here, the primary particle refers to a BaSnO$_3$ precursor single particle, which means in the state of being not aggregated.

In the case of preparing the conventional BaSnO$_3$ nanoparticles, heat treatment at a high temperature of 900° C. or more should be performed for forming BaSnO$_3$ nanoparticles of a perovskite structure, however, in the present invention, a crystalline BaSnO$_3$ precursor material which may be easily transferred to a perovskite structure is first prepared, thereby preparing pure perovskite crystalline phase BaSnO$_3$ only with heat treatment at a low temperature of 100 to 600° C.

In addition, the crystalline BaSnO$_3$ precursor material has a very fine size, in the form of primary particles which do not aggregate together, thereby capable of being very evenly dispersed when being dispersed in a disperse medium, and when preparing a thin film using the precursor material, there is an advantage in that a crystalline BaSnO$_3$ precursor thin film in which the crystalline BaSnO$_3$ precursor material is very evenly and uniformly dispersed may be prepared.

In an exemplary embodiment of the present invention, the crystalline BaSnO$_3$ precursor material may satisfy the following Chemical Formula 1, as mentioned above:

BaSnO$_{3-x}$(O$_2$)$_x$·nH$_2$O·mOH [Chemical Formula 1]

wherein x is a real number of 0≤x≤3, n is a real number of 0≤n≤4, and m is a real number of 0≤n≤4.

As the crystalline BaSnO$_3$ precursor material satisfying Chemical Formula 1 is transformed into pure perovskite crystalline phase BaSnO$_3$ only with heat treatment at a low temperature, heat treatment at a high temperature of 900° C. or more like the conventional heat treatment is not required.

In addition, the crystalline BaSnO$_3$ precursor material may have an average particle diameter of 5 to 100 nm, and more preferably 10 to 30 nm for improving conversion efficiency later when manufacturing a solar cell including the BaSnO$_3$ thin film.

More preferably, the crystalline BaSnO$_3$ precursor material may satisfy the following Equation 1:

$T_1 \times 0.8 \leq T_2 \leq T_1$ [Equation 1]

wherein T$_1$ is a transmittance immediately after the crystalline BaSnO$_3$ precursor material is dispersed in a polar organic solvent, and T$_2$ is a transmittance one hour after the crystalline BaSnO$_3$ precursor material is dispersed in the polar organic solvent.

That is, as the crystalline BaSnO$_3$ precursor material according to an exemplary embodiment of the present invention has a very small average particle diameter, it may be very evenly dispersed in the polar organic solvent when being dispersed in the polar organic solvent, and also as the crystalline BaSnO$_3$ precursor material is not precipitated well even after time has elapsed, a flat and uniform thin film may be prepared when preparing a thin film. As an example, T$_1$ according to an exemplary embodiment of the present invention may be varied depending on the amount of crystalline BaSnO$_3$ precursor material to be added, which is dispersed in the polar organic solvent, however, may be 50% to 95% at a wavelength of 600 nm. The transmittance in the present invention may be measured based on a dispersion in which 50 ml of the polar organic solvent and 1 g of the crystalline BaSnO$_3$ precursor material are mixed, and the polar organic solvent is not particularly limited, but may be ethanol.

In addition, the present invention may provide a crystalline BaSnO$_3$ precursor dispersion including the crystalline BaSnO$_3$ precursor material. Here, the crystalline BaSnO$_3$ precursor dispersion may be produced by dispersing the crystalline BaSnO$_3$ precursor material in the polar organic solvent or the like.

As described above, in the case of preparing a dispersion using perovskite crystalline phase BaSnO$_3$ particles prepared by heat treatment at a high temperature of 900° C. or more, BaSnO$_3$ particles are not evenly dispersed in the dispersion, and aggregation of BaSnO$_3$ particles may occur. Accordingly, when preparing a BaSnO$_3$ thin film using the dispersion, defects may easily occur, and there was a disadvantage of lowered efficiency of a battery.

However, in the present invention, by preparing a dispersion by dispersing the crystalline BaSnO$_3$ precursor material having excellent dispersibility in the polar organic solvent in the polar organic solvent, aggregation of BaSnO$_3$ particles when preparing a BaSnO$_3$ thin film may be prevented, and perovskite crystalline phase BaSnO$_3$ is very evenly dispersed, thereby preparing a flat and dense BaSnO$_3$ thin film.

Here, the polar organic solvent is not particularly limited as long as the crystalline BaSnO$_3$ precursor material is well dispersed in the solvent, and as an example, may be a protic polar organic solvent, an aprotic polar organic solvent or a mixture thereof. Specifically, the protic polar organic solvent may be water such as distilled water, purified water and the like; alcohol-based solvents such as methanol, ethanol, methoxyethanol, propanol, isopropanol, butanol, isobutanol and the like; acid solvents such as acetic acid, formic acid and the like; a nitro-based solvent such as nitromethane and the like; and the like, but not limited thereto. The aprotic polar organic solvent may be ketone-based solvents such as acetone, methylethylketone, methylisobutylketone and the like; ester-based solvents such as ethyl acetate, butyl acetate, 3-methoxy-3-methyl butyl acetate and the like; amine-based solvents such as dimethyl formamide, methyl pyrrolidone, dimethylacetamide and the like; ether-based solvents such as tetrahydrofuran, 2-methyltetrahydrofuran, dimethylether, dibutylether and the like; and the like, but not limited thereto.

In addition, the present invention may provide a crystalline BaSnO$_3$ precursor paste including the crystalline BaSnO$_3$ precursor material. Here, the paste may be prepared by further including an organic material which is commonly used in the art.

When the crystalline BaSnO$_3$ precursor dispersion may prepare a crystalline BaSnO$_3$ precursor thin film having a very dense structure, in the case of preparing a thin film using the crystalline BaSnO$_3$ precursor paste, there is an advantage in that a porous crystalline BaSnO$_3$ precursor thin film may be prepared.

Besides, the present invention relates to BaSnO$_3$ nanoparticles of a perovskite structure, prepared from the crystalline BaSnO$_3$ precursor material.

Specifically, the BaSnO$_3$ nanoparticles of a perovskite structure according to an exemplary embodiment of the present invention may be primary particles having an average particle diameter of 5 to 100 nm. Like the crystalline BaSnO$_3$ precursor material, the BaSnO$_3$ nanoparticles of a perovskite structure also have a very fine size, in the form of primary particles which do not aggregate together, thereby capable of being very evenly dispersed when being dispersed in a disperse medium, and when preparing a thin film using the nanoparticles, there is an advantage in that a BaSnO$_3$ thin film in which the BaSnO$_3$ nanoparticles are very evenly and uniformly dispersed may be prepared.

In addition, the BaSnO₃ nanoparticles of a perovskite structure may have an average particle diameter of 5 to 100 nm, and more preferably 10 to 30 nm for improving conversion efficiency later when manufacturing a solar cell including the BaSnO₃ thin film.

More preferably, the BaSnO₃ nanoparticles of a perovskite structure may satisfy the following Equation 2:

$$T_{11} \times 0.8 \leq T_{22} \leq T_{11} \qquad \text{[Equation 2]}$$

wherein $T_{11}$ is a transmittance immediately after dispersing the BaSnO₃ nanoparticles in a polar organic solvent, and $T_{22}$ is a transmittance one hour after dispersing the BaSnO₃ nanoparticles in the polar organic solvent.

That is, as the crystalline BaSnO₃ nanoparticles according to an exemplary embodiment of the present invention have a very small average particle diameter, the BaSnO₃ nanoparticles may be very evenly dispersed in the polar organic solvent when being dispersed in the polar organic solvent, and also as the crystalline BaSnO₃ nanoparticles are not precipitated well even after time has elapsed, a flat and uniform thin film may be prepared when preparing a thin film. As an example, $T_{11}$ according to an exemplary embodiment of the present invention may be varied depending on the amount of BaSnO₃ nanoparticles to be added, which is dispersed in the polar organic solvent, however, may be 50% to 95% at a wavelength of 600 nm. The transmittance in the present invention may be measured based on a dispersion in which 50 ml of the polar organic solvent and 1 g of the BaSnO₃ nanoparticles are mixed, and the polar organic solvent is not particularly limited, but may be ethanol.

In addition, the present invention may provide a BaSnO₃ nanoparticle dispersion of a perovskite structure including these BaSnO₃ nanoparticles of a perovskite structure. Here, the BaSnO₃ nanoparticle dispersion of a perovskite structure may be produced by dispersing the BaSnO₃ nanoparticles of a perovskite structure in the polar organic solvent or the like.

As described above, in the case of preparing a dispersion using perovskite crystalline phase BaSnO₃ particles prepared by heat treatment at a high temperature of 900° C. or more, BaSnO₃ particles are not evenly dispersed in the dispersion, and aggregation of BaSnO₃ particles may occur. Accordingly, when preparing a BaSnO₃ thin film using the dispersion, defects may easily occur, and there was a disadvantage of lowered efficiency of a battery.

However, in the present invention, by preparing a dispersion by dispersing the BaSnO₃ nanoparticles of a perovskite structure having excellent dispersibility in the polar organic solvent in the polar organic solvent, aggregation of BaSnO₃ nanoparticles when preparing a BaSnO₃ thin film may be prevented, and perovskite crystalline phase BaSnO₃ is very evenly dispersed, thereby preparing a flat and dense BaSnO₃ thin film.

Here, the polar organic solvent may be used without a particular limitation, as long as the BaSnO₃ nanoparticles of a perovskite structure are well dispersed in the solvent, and as an example, may be a protic polar organic solvent, an aprotic polar organic solvent or a mixture thereof. Specifically, the protic polar organic solvent may be water such as distilled water, purified water and the like; alcohol-based solvents such as methanol, ethanol, methoxyethanol, propanol, isopropanol, butanol, isobutanol and the like; acid solvents such as acetic acid, formic acid and the like; a nitro-based solvent such as nitromethane and the like; and the like, but not limited thereto. The aprotic polar organic solvent may be ketone-based solvents such as acetone, methylethylketone, methylisobutylketone and the like; ester-based solvents such as ethyl acetate, butyl acetate, 3-methoxy-3-methyl butyl acetate and the like; amine-based solvents such as dimethyl formamide, methyl pyrrolidone, dimethylacetamide and the like; ether-based solvents such as tetrahydrofuran, 2-methyltetrahydrofuran, dimethylether, dibutylether and the like; and the like, but not limited thereto.

In addition, the present invention may provide a BaSnO₃ nanoparticle paste of a perovskite structure including the BaSnO₃ nanoparticles of a perovskite structure. Here, the paste may be prepared by further including an organic material which is commonly used in the art.

When the BaSnO₃ nanoparticle dispersion may prepare a BaSnO₃ thin film having a very dense structure, in the case of preparing a thin film using the BaSnO₃ nanoparticle paste of a perovskite structure, a porous BaSnO₃ thin film may be prepared.

In another general aspect, an inorganic-organic hybrid halide perovskite solar cell includes: a BaSnO₃ thin film of a perovskite structure prepared with a BaSnO₃ nanoparticle dispersion or paste of a perovskite structure having an average particle diameter of 5 to 100 nm.

More specifically, the perovskite solar cell according to an exemplary embodiment of the present invention may have sunlight intensity of 1,000 W/m² and conversion efficiency ($\eta$; energy conversion efficiency) at a constant temperature condition of 25° C. of 18% or more.

As described above, the BaSnO₃ thin film containing BaSnO₃ of a perovskite structure is prepared by using the dispersion in which the crystalline BaSnO₃ precursor material having excellent dispersibility in a polar organic solvent is dispersed in a polar organic solvent to prevent aggregation of BaSnO₃ particles, thereby forming very uniform perovskite crystalline phase BaSnO₃. Accordingly, the perovskite crystalline phase BaSnO₃ is very evenly dispersed, thereby preparing a flat and dense BaSnO₃ thin film, and the perovskite solar cell manufactured including the thin film may have sunlight intensity of 1,000 W/m² and conversion efficiency ($\eta$; energy conversion efficiency) at a constant temperature condition of 25° C. of 18% or more.

Here, the BaSnO₃ thin film in the perovskite solar cell may have a thickness of 10 to 300 nm, more preferably 30 to 150 nm. With the thickness satisfying the range, performance of the solar cell may be maximized.

In addition, another exemplary embodiment of the present invention relates to a method for synthesizing BaSnO₃ nanoparticles including: A) adding an alkaline aqueous solution to a mixed solution including a barium salt, a tin salt, a hydrogen peroxide solution and an organic acid to precipitate an amorphous precipitate; B) preheat-treating the mixed solution including the amorphous precipitate to prepare a crystalline BaSnO₃ precursor material; and C) heat-treating the crystalline BaSnO₃ precursor material to synthesize BaSnO₃ nanoparticles of a perovskite structure.

Here, steps A) and B) of the method for synthesizing BaSnO₃ nanoparticles are identical to steps a) and b) of the method for preparing a BaSnO₃ thin film at a low temperature.

Specifically, first, step A) of adding an alkaline aqueous solution to a mixed solution including a barium salt, a tin salt, a hydrogen peroxide solution and an organic acid to precipitate an amorphous precipitate may be performed.

In an exemplary embodiment of the present invention, it is preferred to add the barium salt:the tin salt at a mole ratio of 1:0.8 to 1.2, and more preferably, it is effective to add the salts at a mole ratio of 1:1, for preparing pure perovskite crystalline phase BaSnO₃ nanoparticles later when forming BaSnO₃ nanoparticles. Here, as the barium salt and the tin salt, any inorganic salt source may be used without a limitation, as long as it is commonly used in the art, and as a specific example thereof, the barium salt may be any one or two or more selected from the group consisting of $BaCl_2$, $Ba(NO_3)_2$, $BaSO_4$, $Ba(OH)_2$, $Ba(CH_3COO)_2$ and hydrates thereof; and the tin salt may be any one or two or more selected from the group consisting of $SnCl_4$, $Sn(NO_3)_4$, $Sn(SO_4)_2$, $Sn(OH)_4$, $Sn(CH_3COO)_4$ and hydrates thereof.

In an exemplary embodiment of the present invention, the hydrogen peroxide solution may inhibit formation of a $BaSn(OH)_6$ intermediate phase, effectively form an amorphous precipitate satisfying $BaSnO_{3-x}(O_2)_x \cdot nH_2O$ (wherein x is a real number of $0 \leq x \leq 3$, and n is a real number of $0 \leq n \leq 4$), and prepare a crystalline phase $BaSnO_3$ precursor material after preheating treatment. Here, in order to prepare a crystalline phase $BaSnO_3$ precursor material, it is necessary to adjust a concentration of the hydrogen peroxide solution, and specifically, the concentration of the hydrogen peroxide solution is preferably 10 to 50 vol %, more preferably 12 to 35 vol %. When the concentration of the hydrogen peroxide solution is less than 10 vol %, the crystalline $BaSnO_3$ precursor material is not synthesized, and accordingly, it may be difficult to prepare perovskite crystalline phase $BaSnO_3$ nanoparticles only with the subsequent heat treatment at a low temperature.

In addition, it is preferred to vary an amount of hydrogen peroxide solution to be added, which is mixed in the mixed solution, depending on the concentration of the hydrogen peroxide solution. As a specific example, when the concentration of the hydrogen peroxide solution is 10 to 50 wt %, 5 to 500 ml of the hydrogen peroxide solution may be added, with respect to 0.01 mol of the barium salt, and more preferably 20 to 300 ml of the hydrogen peroxide solution may be added, with respect to 0.01 mol of the barium salt.

In an exemplary embodiment of the present invention, the organic acid is added for inhibiting aggregation of primary particles when forming the amorphous precipitate, and as described below, when adding the alkaline aqueous solution to the mixed solution of the present invention, the amorphous precipitate is immediately formed, and the amorphous precipitate is an aggregate of primary particles, and the aggregation of primary particles is inhibited by adding the organic acid, thereby capable of forming the amorphous precipitate having a very fine size. In order to maximize this effect, it is preferred to adjust an amount of organic acid to be added, and specifically, the organic acid may be added at 0.01 to 10 mol, more preferably at 0.05 to 5 mol, still more preferably at 0.1 to 2 mol, with respect to 1 mol of the barium salt, for synthesizing nano-sized amorphous precipitate and crystalline $BaSnO_3$ precursor material.

The organic acid may be used without a particular limitation as long as it is used in the art, and specific examples thereof may be any one or two or more selected from the group consisting of citric acid, ascorbic acid, formic acid, acetic acid, butanoic acid, pentanoic acid, malonic acid, maleic acid, glycolic acid, succinic acid, glutaric acid, tartaric acid, propionic acid, gluconic acid, fumaric acid, adipic acid, glutaric acid and oxalic acid.

As described above, when the mixed solution including the barium salt, the tin salt, the hydrogen peroxide solution and the organic acid is prepared, an alkaline aqueous solution may be added to the mixed solution to precipitate an amorphous precipitate. The alkaline aqueous solution changes the condition of the mixed solution to basic, so that an inorganic salt source is precipitated into an amorphous precipitate, and as a specific example, the alkaline aqueous solution may be added to the mixed solution so that the pH of the mixed solution is 9 to 11.

The alkaline aqueous solution is not particularly limited as long as it is commonly used in the art, and specifically for example, may be any one or two or more selected from the group consisting of ammonia water, an aqueous sodium hydroxide solution, an aqueous potassium hydroxide solution, an aqueous calcium hydroxide solution, an aqueous magnesium hydroxide solution, an aqueous sodium hydrogen carbonate solution and the like.

As such, the precipitate may be amorphous particles satisfying $BaSnO_{3-x}(O_2)_x \cdot nH_2O$ (wherein x is a real number of $0 \leq x \leq 3$, and n is a real number of $0 \leq n \leq 4$), which is heat-treated at a low temperature to be crystallized into a crystalline $BaSnO_3$ precursor material having a pure perovskite crystalline phase or an incomplete perovskite crystalline phase.

Specifically, after the precipitation step, step B) of preheat-treating the mixed solution including the amorphous precipitate to prepare a crystalline $BaSnO_3$ precursor material may be performed. When the amorphous precipitate is aged at room temperature (25° C.), the amorphous precipitate is not crystallized and retains an amorphous form, however, when the precipitate is preheat-treated, the particles are crystallized to be transformed into a crystalline $BaSnO_3$ precursor material having a crystalline phase.

Specifically, in an exemplary embodiment of the present invention, the preheating treatment in step B) may be performed at 40 to 100° C. Within the range, the amorphous precipitate is easily transformed into a crystalline phase $BaSnO_3$ precursor material, and a $BaSnO_3$ thin film containing $BaSnO_3$ of a pure perovskite structure may be prepared later, and conversion efficiency of a solar cell including the thin film may be significantly improved.

In addition, in an exemplary embodiment of the present invention, the preheating treatment in step B) may be performed for 10 minutes to 48 hours, and more preferably 0.5 hours to 24 hours. Within the range, the amorphous precipitate may be completely transformed into a crystalline $BaSnO_3$ precursor material having a crystalline phase.

Here, when the manufacture of the $BaSnO_3$ precursor material is completed by the heat treatment in step B), the crystalline $BaSnO_3$ precursor material may be subjected to washing and drying processes by a common method, of course.

Next, step C) of heat-treating the crystalline $BaSnO_3$ precursor material to synthesize $BaSnO_3$ nanoparticles of a perovskite structure may be performed.

As described above, in the conventional case, heat treatment at a high temperature of 900° C. or more should be performed for preparing $BaSnO_3$ nanoparticles of a perovskite structure, however, in the present invention, a crystalline $BaSnO_3$ precursor material which may be easily transferred to a perovskite structure is first prepared and then heat-treated, thereby preparing pure perovskite crystalline phase $BaSnO_3$ nanoparticles only with heat treatment at a low temperature.

In an exemplary embodiment of the present invention, the heat treatment in step C) may be performed at 150 to 600° C., more preferably at 400 to 550° C. for more effective preparation of the perovskite crystalline phase $BaSnO_3$ nanoparticles.

Hereinafter, the method for preparing a $BaSnO_3$ thin film at a low temperature according to the present invention will be described in more detail by the following Examples. However, the following Examples are only a reference for describing the present invention in detail, and the present invention is not limited thereto, and may be implemented in various forms.

In addition, unless otherwise defined, all technical terms and scientific terms have the same meanings as those commonly understood by a person skilled in the art to which the present invention pertains. The terms used herein is only for effectively describing a certain exemplary embodiment, and not intended to limit the present invention. Further, unless otherwise stated, the unit of added materials herein may be wt %.

Preparation of Crystalline Barium Stannate Precursor Material and Barium Stannate Precursor Material Dispersion

Example 1

3.577 g (0.01 mol) of $SnCl_4$-$5H_2O$ and 2.467 g (0.01 mol) of $BaCl_2$-$2H_2O$ were added to 170 ml of a 30 vol % hydrogen peroxide solution, and 1 g (0.005 mol) of citric acid was added thereto, thereby preparing a mixed solution.

An ammonia solution was added to the mixed solution so that the pH of the mixed solution was 10, thereby causing precipitation to form an amorphous precipitate, which was aged at 50° C. for 12 hours to prepare a crystalline $BaSnO_3$ precursor material.

Figure 4:
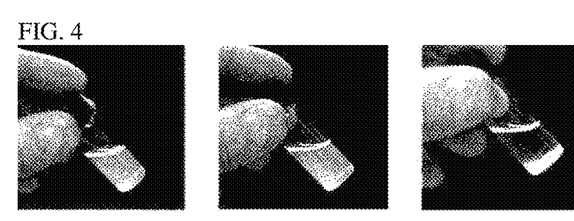
FIG. 4 is a photograph of a dispersion prepared according to Example 1 and Comparative Example 4.
Figure 5:
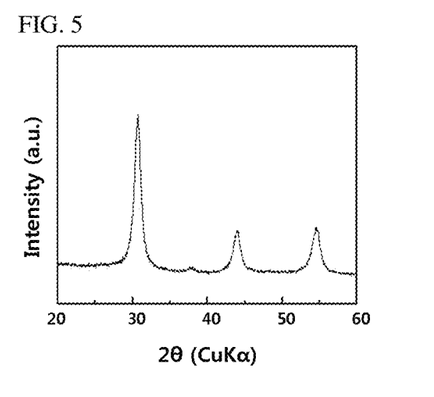
FIG. 5 is an X-ray diffraction pattern of a BaSnO$_3$ thin film prepared according to Example 1 of the present invention.

Subsequently, the thus-obtained barium stannate ($BaSnO_3$) precursor material was washed with water and ethanol, and then 1 g of the $BaSnO_3$ precursor material was dispersed in 50 ml of 2-methoxyethanol to prepare a dispersion. A photograph of the dispersion is shown in FIG. 4 (left), and it is confirmed that the precursor material was well dispersed without a precipitate.

Examples 2 and 3, and Comparative Examples 1 and 2

All processes were performed in the same manner as in Example 1, except that the concentration of hydrogen peroxide solution was changed as indicated in Table 1. The hydrogen peroxide solution was diluted by mixing the hydrogen peroxide solution of 30 vol % and water at a volume ratio, and the total volume of the diluted hydrogen peroxide solution was the same at 170 ml.

TABLE 1

| | $H_2O_2$:$H_2O$ volume ratio | $H_2O_2$ concentration (vol %) |
|---|---|---|
| Example 1 | 1:0 | 30 |
| Example 2 | 0.75:0.25 | 22.5 |
| Example 3 | 0.5:0.5 | 15 |
| Comparative Example 1 | 0.25:0.75 | 7.5 |
| Comparative Example 2 | 0:1 | 0 |

Figure 1:
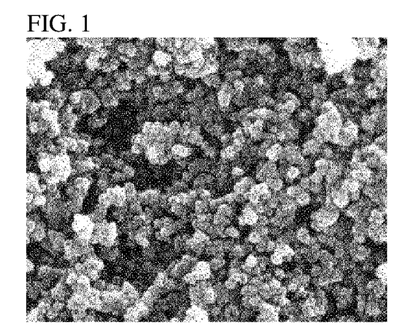
FIG. 1 is an electron microscope image of a BaSnO$_3$ precursor material prepared according to Example 1 of the present invention.
Figure 2:
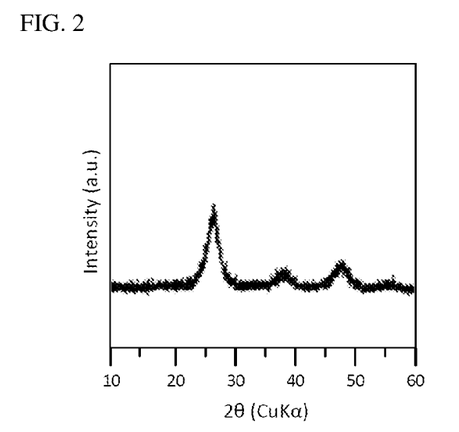
FIG. 2 is an X-ray diffraction pattern of a BaSnO$_3$ precursor material prepared according to Example 1 of the present invention.
Figure 3:
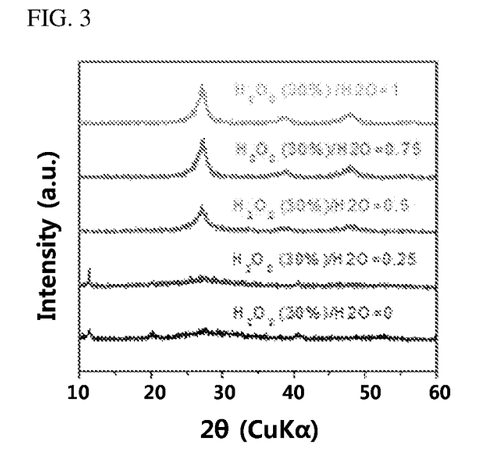
FIG. 3 is an X-ray diffraction pattern of a BaSnO$_3$ precursor material prepared by changing a concentration of a hydrogen peroxide solution.

As a result of performing Examples 1 to 3, and Comparative Examples 1 and 2, as shown in FIG. 3, it was confirmed that in Examples 1 to 3 a hydrogen peroxide solution satisfying a concentration of 10 to 50 vol % was used, thereby effectively synthesizing a crystalline $BaSnO_3$ precursor material, however, in Comparative Examples 1 and 2, a hydrogen peroxide solution having a concentration less than 10 vol % was used, thereby not synthesizing the crystalline $BaSnO_3$ precursor material.

Preparation of Crystalline Barium Stannate Nanoparticles and Barium Stannate Dispersion

Example 4

3.577 g (0.01 mol) of $SnCl_{4-5}H_2O$ and 2.467 g (0.01 mol) of $BaCl_2$-$2H_2O$ were added to 170 ml of a 30 vol % hydrogen peroxide solution, and 1 g (0.005 mol) of citric acid was added thereto, thereby preparing a mixed solution.

An ammonia solution was added to the mixed solution so that the pH of the mixed solution was 10, thereby causing precipitation to form an amorphous precipitate, which was aged at 50° C. for 12 hours to prepare a crystalline $BaSnO_3$ precursor material.

Subsequently, the obtained crystalline $BaSnO_3$ precursor material was heat-treated in the air at 500° C. for 1 hour to synthesize $BaSnO_3$ nanoparticle powder having a pure $BaSnO_3$ perovskite structure, and 1 g of this powder was dispersed in 50 ml of 2-methoxyethanol to prepare a $BaSnO_3$ dispersion. A photograph of the $BaSnO_3$ dispersion is shown in FIG. 4 (middle), and it is confirmed that the powder was well dispersed without a precipitate.

Comparative Example 3

3.577 g (0.01 mol) of $SnCl_{4-5}H_2O$ and 2.467 g (0.01 mol) of $BaCl_2$-$2H_2O$ were added to 170 ml of a 30 wt % hydrogen peroxide solution, and 1 g (0.005 mol) of citric acid was added thereto, thereby preparing a mixed solution.

An ammonia solution was added to the mixed solution so that the pH of the mixed solution was 10, thereby causing precipitation to form an amorphous precipitate, which was aged at room temperature (25° C.), not at a preheating condition, for 12 hours to prepare an amorphous $BaSnO_3$ precursor material. The material was heat-treated at 500° C. for 2 hours, but $BaSnO_3$ of a perovskite structure was not formed. 1 g of the powder was dispersed in 50 ml of 2-methoxyethanol to prepare a $BaSnO_3$ dispersion.

Comparative Example 4

An amorphous $BaSnO_3$ precursor material was synthesized in the same manner as in Comparative Example 3, and then heat-treated at 900° C. for transforming the phase to a perovskite structure. As a result, $BaSnO_3$ powder of a perovskite structure was synthesized.

Subsequently, as described in Example 4, 1 g of this powder was dispersed in 50 ml of 2-methoxyethanol to prepare a $BaSnO_3$ dispersion, which is shown in FIG. 4 (right). As seen from the photograph, it is confirmed that the $BaSnO_3$ powder of a perovskite structure was not dispersed well, and precipitated.

Preparation of Barium Stannate Thin Film

Preparation Examples 1 to 3

A glass substrate on which a fluorine-containing tin oxide was coated (FTO; F-doped $SnO_2$, 8 ohms/$cm^2$, Pilkington, hereinafter, referred to as FTO substrate (first electrode)) was cut into a size of 25×25 mm, and then an end portion thereof was etched, thereby partially removing FTO.

On the cut and partially etched FTO substrate, the $BaSnO_3$ precursor material dispersion which was prepared in Examples 1 to 3 was coated by spin coating at 3000 rpm for 30 seconds, and heat-treated at 500° C. for 2 hours to form a $BaSnO_3$ thin film having a thickness of 100 nm, containing $BaSnO_3$ of a perovskite structure.

Figure 6:
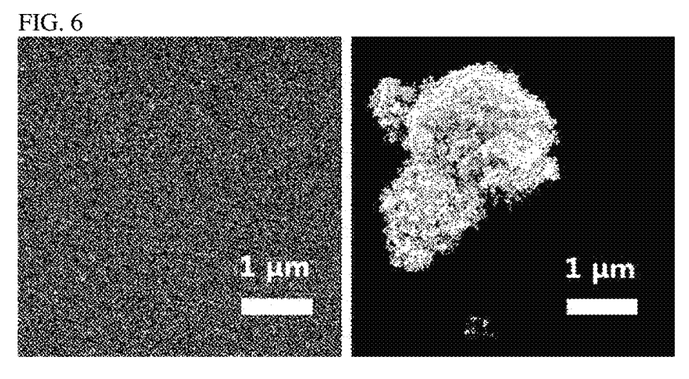
FIG. 6 is an electron microscope image of a BaSnO$_3$ thin film prepared according to Example 1 and Comparative Example 4 of the present invention.
Figure 7:
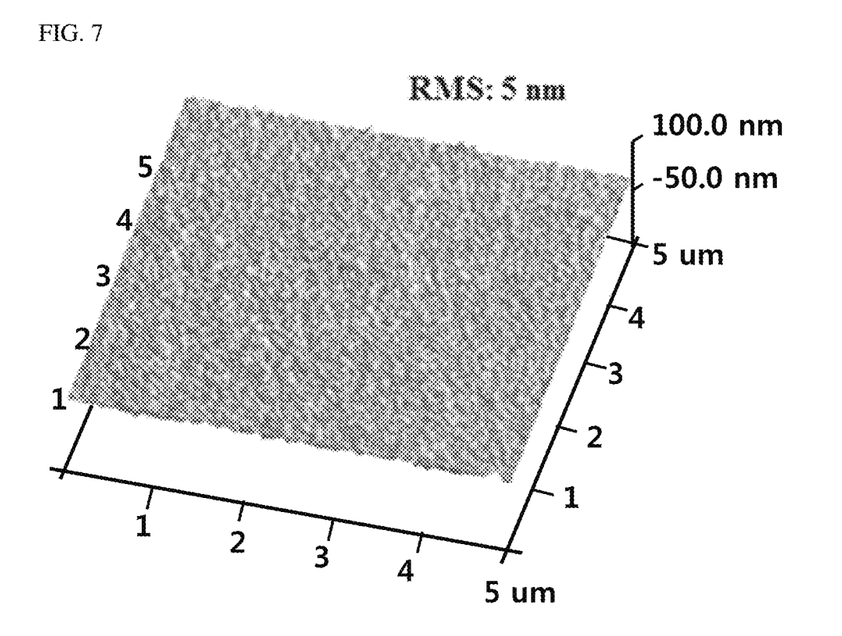
FIG. 7 is an atomic force microscope (AFM) image of a BaSnO$_3$ thin film prepared according to Example 1 and Comparative Example 4 of the present invention.

An SEM image of the thus-formed BaSnO$_3$ thin film is shown in FIG. 6 (left), and it is found therefrom that a uniform and dense film was formed. In addition, FIG. 7 shows a result of measuring the BaSnO$_3$ thin film with an atomic force microscope, and it is found that a very flat thin film in which an RMS roughness was about 5 nm was formed.

Comparative Preparation Examples 1 to 4

All processes were performed in the same manner as in Preparation Example 1, except using the dispersion prepared in Comparative Examples 1 to 4. Among them, the electron microscope image of the thin film prepared using the dispersion prepared in Comparative Example 4 is shown in FIG. 6 (right). It was confirmed that powder aggregated together, so that a dense film was not formed.

Manufacture of Solar Cell

Preparation Examples 4 to 6, and Comparative Preparation Examples 5 to 8

A perovskite solar cell including the BaSnO$_3$ thin film prepared in Preparation Examples 1 to 3, and Comparative Preparation Examples 1 to 4 was manufactured, using a common method.

a) Preparation of Organic Metal Halide Solution

A CH$_3$NH$_3$PbI$_3$ solution at a concentration of 0.8 M was prepared by using a mixed solvent of γ-butyrolactone and dimethyl sulfoxide at a volume ratio of 7:3, and dissolving CH$_3$NH$_3$I and PbI$_2$ at a mole ratio of 1:1 in the mixed solvent.

b) Manufacture of Solar Cell

On the upper portion of an FTO/BaSnO$_3$ thin film prepared in Preparation Examples 1 to 3, and Comparative Preparation Examples 1 to 4, the CH$_3$NH$_3$PbI$_3$ solution prepared above was coated (injected) on a rotation center batchwise, and spin-coated at 3000 rpm. At the point of 50 seconds after starting spin coating, 1 ml of non-solvent, toluene was coated (injected) batchwise again on the rotation center of the FTO substrate being spun, and then spin-coated for another 5 seconds. After spin coating was performed, annealing was performed under the condition of a temperature of 100° C. and normal pressure for 30 minutes, thereby forming a perovskite compound film (a light absorbing layer) which is a perovskite light absorber.

Thereafter, on the upper portion of the light absorbing layer, a toluene solution [15 mg (PTAA)/1 ml] in which PTAA (poly(triarylamine), EM index, Mw=17,500 g/mol) is dissolved was spin-coated at 3000 rpm for 60 seconds, thereby forming a hole transporting layer. Here, 2.31 mg of LiTFSI (Lithium Bis(Trifluoro methanesulfonyl) Imide) and 6.28 mg of TBP (tertiary butyl pyridine) were added to the PTAA solution.

Thereafter, Au was vacuum-deposited on the upper portion of the hole transporting layer by a thermal evaporator of high vacuum (5×10$^{-6}$ torr or less) to form an Au electrode (second electrode) having a thickness of 70 nm, thereby manufacturing a solar cell. During the manufacture of the solar cell, the surrounding environment was maintained at a temperature of 25° C. and a relative humidity of 25%.

In addition, in order to measure current-voltage properties of the manufactured perovskite solar cell, an artificial solar device (ORIEL class A solar simulator, Newport, model 91195A), and a source-meter (Kethley, model 2420) were used, and the measurement was performed at sunlight intensity of 1,000 W/m$^2$ and a constant temperature of 25° C. which are a standard test condition. In addition, the results are shown in Table 2:

TABLE 2

| | Thin film | Open circuit voltage ($V_{oc}$, V) | Short circuit current density ($J_{sc}$, mA/cm$^2$) | Fill factor (FF, %) | Conversion efficiency (η, %) |
|---|---|---|---|---|---|
| Preparation Example 4 | Preparation Example 1 | 1.15 | 23.60 | 80.80 | 21.93 |
| Preparation Example 5 | Preparation Example 2 | 1.12 | 23.56 | 80.20 | 21.16 |
| Preparation Example 6 | Preparation Example 3 | 1.07 | 23.55 | 78.60 | 19.81 |
| Comparative Preparation Example 5 | Comparative Preparation Example 1 | 0.88 | 18.20 | 62.00 | 9.93 |
| Comparative Preparation Example 6 | Comparative Preparation Example 2 | 0.87 | 17.40 | 55.00 | 8.33 |
| Comparative Preparation Example 7 | Comparative Preparation Example 3 | 0.55 | 12.30 | 45.30 | 3.06 |
| Comparative Preparation Example 8 | Comparative Preparation Example 4 | 0.42 | 11.6 | 38.1 | 1.85 |

As seen from the above Table 2, in Preparation Examples 4 to 6 of the present invention, it was confirmed that the BaSnO$_3$ thin film was prepared by using a dispersion in which the crystalline BaSnO$_3$ precursor material is not aggregated and evenly dispersed, thereby having an excellent fill factor and conversion efficiency when manufacturing a solar cell.

However, in Comparative Preparation Examples 5 to 8, it was confirmed that the performance of the solar cell was significantly deteriorated as compared with the present invention. Specifically, in Comparative Preparation Examples 5 to 7, it is determined that as a dispersion in which the crystalline BaSnO$_3$ precursor material was not synthesized was used, the BaSnO$_3$ precursor material was not effectively phase-transformed into BaSnO$_3$ of a perovskite structure at a condition of a low temperature of 500° C., thereby deteriorating the performance of the solar cell, and in Comparative Preparation Example 8, it is determined that though a dispersion in which BaSnO$_3$ powder having a perovskite structure was dispersed was used, the BaSnO$_3$ powder was not evenly dispersed and aggregated, so that a uniform and dense thin film was not prepared when forming the thin film, thereby deteriorating the performance of the solar cell.

Preparation of Barium Stannate Precursor Material Paste and Manufacture of Solar Cell Preparation Example 7

A crystalline BaSnO$_3$ precursor material was prepared in the same manner as in Example 1.

Subsequently, the obtained crystalline BaSnO$_3$ precursor material and terpinol/ethyl cellulose were used to prepare a paste.

Specifically, 5 ml of an ethyl cellulose solution in which ethyl cellulose at 10 wt % was dissolved in ethanol was added per 1 g of the BaSnO$_3$ precursor nanoparticle powder, and 5 g of terpinol was added per 1 g of the BaSnO$_3$ precursor nanoparticles and mixed, and then ethanol was removed by distillation under reduced pressure to prepare a BaSnO$_3$ precursor nanoparticle paste.

To the BaSnO$_3$ precursor nanoparticle paste, ethanol was added (paste:ethanol=1:5 by weight ratio) to prepare BaSnO$_3$ precursor nanoparticle slurry for spin coating.

On the upper portion of the BaSnO$_3$ thin film coated on the upper portion of the FTO substrate prepared in Preparation Example 1, the BaSnO$_3$ precursor nanoparticle slurry for spin coating was used for spin coating at 3000 rpm, and heat-treated at 500° C. for 1 hour to prepare a porous BaSnO$_3$ nanoparticle thin film (porous electron carrier). Here, the porous BaSnO$_3$ nanoparticle thin film had a thickness of 150 nm, and the prepare porous electron carrier had a specific surface area of 33 m$^2$/g and porosity (apparent porosity) of 50%.

On the upper portion of the porous BaSnO$_3$ nanoparticle thin film, a light absorbing layer, a hole transport layer and an Au electrode were formed to manufacture a perovskite solar cell, as described in Preparation Example 4. The current-voltage properties of the thus-manufactured perovskite solar cell were measured in the same manner as in Preparation Example 4, and the results are shown in Table 3.

Preparation Example 8

All processes were performed in the same manner as in Preparation Example 7, except that the materials of the BaSnO$_3$ thin film and the light absorbing layer were changed, and the current-voltage properties of the thus-manufactured perovskite solar cell were measured in the same manner as in Preparation Example 4, and the results are shown in Table 3.

Specifically, the light absorbing solution for forming the light absorbing layer was prepared as follows. A light absorbing solution at a concentration of 0.8 M was prepared by using a mixed solvent in which dimethyl formamide and dimethyl sulfoxide were mixed at a volume ratio of 8:2, and dissolving formamidinium iodide (CH(NH$_2$)$_2$I; FAI), methylammonium bromide CH$_3$NH$_3$Br (MABr), formamidinium bromide (CH(NH$_2$)$_2$Br; FABr), PbI$_2$ and PbBr$_2$ at a desired composition in the mixed solvent. The prepared composition of the light absorbing solution was (FA$_{0.95}$MA$_{0.05}$)Pb(I$_{0.95}$Br$_{0.05}$)$_3$.

Thereafter, on the porous electrode on which the porous electron carrier of Preparation Example 7 was formed, the thus-prepared light absorbing solution was coated (injected) on the rotation center batchwise, and spin-coated at 5000 rpm. At the point of 50 seconds after starting spin coating, 1 ml of non-solvent, toluene was coated (injected) batchwise again on a rotation center of the porous electrode being rotated, and then spin coating proceeded for another 1 minute. After spin coating was performed, annealing was performed under the condition of a temperature of 150° C. and normal pressure for 20 minutes, thereby forming a perovskite light absorber.

TABLE 3

| | Thin film | Open circuit voltage ($V_{oc}$, V) | Short circuit current density ($J_{sc}$, mA/cm$^2$) | Fill factor (FF, %) | Conversion efficiency ($\eta$, %) |
|---|---|---|---|---|---|
| Preparation Example 7 | Preparation Example 1 | 1.13 | 23.6 | 82.9 | 22.10 |
| Preparation Example 8 | Preparation Example 2 | 1.12 | 25.3 | 82.7 | 23.43 |

As seen from the above Table 3, in Preparation Examples 7 and 8 of the present invention, it was confirmed that the BaSnO$_3$ thin film was prepared by using a dispersion in which the crystalline BaSnO$_3$ precursor material is not aggregated and evenly dispersed, thereby having an excellent fill factor and conversion efficiency when manufacturing a solar cell.

Hereinabove, although the present invention has been described by specific matters, Examples, and Comparative Examples, they have been provided only for assisting in the entire understanding of the present invention. Therefore, the present invention is not limited to the above Examples. Various modifications and changes may be made by those skilled in the art to which the present invention pertains from this description.

Therefore, the spirit of the present invention should not be limited to the above-described exemplary embodiments, and the following claims as well as all modified equally or equivalently to the claims are intended to fall within the scope and spirit of the invention.

The invention claimed is:

1. A method for preparing a BaSnO$_3$ thin film at a low temperature, comprising:
   a) adding an alkaline aqueous solution to a mixed solution including a barium salt, a tin salt, a hydrogen peroxide solution and an organic acid to precipitate an amorphous precipitate;
   b) preheat-treating the mixed solution including the amorphous precipitate to prepare a crystalline BaSnO$_3$ precursor material, wherein the preheat-treating is performed at 40 to 100° C.;
   c) dispersing the crystalline BaSnO$_3$ precursor material in a polar organic solvent to prepare a dispersion;
   d) coating the dispersion on a substrate; and
   e) heat-treating the dispersion coated on the substrate to prepare a BaSnO$_3$ thin film of a perovskite structure.

2. The method for preparing a BaSnO₃ thin film at a low temperature of claim 1, wherein the heat-treating in e) is performed at 100 to 600° C.

3. The method for preparing a BaSnO₃ thin film at a low temperature of claim 1, wherein the barium salt:the tin salt are added at a mole ratio of 1:0.8 to 1.2.

4. The method for preparing a BaSnO₃ thin film at a low temperature of claim 1, wherein a concentration of the hydrogen peroxide solution is 10 to 50 vol %.

5. A method for synthesizing BaSnO₃ nanoparticles comprising:
   A) adding an alkaline aqueous solution to a mixed solution including a barium salt, a tin salt, a hydrogen peroxide solution and an organic acid to precipitate an amorphous precipitate;
   B) preheat-treating the mixed solution including the amorphous precipitate to prepare a crystalline BaSnO₃ precursor material, wherein the preheat-treating is performed at 40 to 100° C.; and
   C) heat-treating the crystalline BaSnO₃ precursor material to synthesize BaSnO₃ nanoparticles of a perovskite structure.

\* \* \* \* \*